(12) United States Patent
Hu et al.

(10) Patent No.: US 10,847,496 B2
(45) Date of Patent: *Nov. 24, 2020

(54) CHIP WIRING METHOD AND STRUCTURE

(71) Applicant: SHENZHEN XIUYUAN ELECTRONIC TECHNOLOGY CO., LTD, Shenzhen (CN)

(72) Inventors: Chuan Hu, Chandler, AZ (US); Junjun Liu, Albany, NY (US)

(73) Assignee: SHENZHEN XIUYUAN ELECTRONIC TECHNOLOGY CO., LTD, Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/465,059

(22) PCT Filed: Mar. 13, 2017

(86) PCT No.: PCT/CN2017/076430
§ 371 (c)(1),
(2) Date: May 29, 2019

(87) PCT Pub. No.: WO2018/098922
PCT Pub. Date: Jun. 7, 2018

(65) Prior Publication Data
US 2019/0295982 A1  Sep. 26, 2019

(30) Foreign Application Priority Data
Nov. 29, 2016 (WO) ................ PCT/CN2016/107833

(51) Int. Cl.
*H01L 23/00* (2006.01)
*H01L 21/48* (2006.01)
(Continued)

(52) U.S. Cl.
CPC ............ *H01L 24/83* (2013.01); *H01L 21/486* (2013.01); *H01L 21/4853* (2013.01);
(Continued)

(58) Field of Classification Search
CPC ..... H01L 24/83; H01L 21/4864; H01L 21/56; H01L 23/3128; H01L 23/49816;
(Continued)

(56) References Cited

U.S. PATENT DOCUMENTS 5,171,712 A  12/1992  Wang et al.
5,407,864 A   4/1995  Kim
(Continued)

FOREIGN PATENT DOCUMENTS

CN   1348204 A    5/2002
CN 101199242 A    6/2008
CN 104756247 A    9/2017

OTHER PUBLICATIONS

Search Report and Written Opinion for PCT/CN2016/107833 dated Jul. 27, 2017 including translation.
(Continued)

*Primary Examiner* — Su C Kim
(74) *Attorney, Agent, or Firm* — Benjamin C. Armitage; Billion & Armitage

(57) ABSTRACT

A chip connection method and structure are provided. The method includes: providing a first connection line and a second connection line on a substrate, wherein, in the thickness direction of the substrate, a distance between the first connection line and the chip is smaller than a distance between the second connection line and the chip; providing the chip on a top surface of the substrate, the chip being provided with at least two chip pins; and providing the substrate with a second through hole corresponding to the second connecting line and provided therein with a second
(Continued)

conductive layer, at least one chip pin being electrically connected to the first connection line, and at least one of the remaining chip pin being corresponding to a first opening of the second through, and the second conductive layer electrically connecting the chip pin and the second connection line.

19 Claims, 9 Drawing Sheets

(51) Int. Cl.
      *H01L 23/498*       (2006.01)
      *H01L 23/12*         (2006.01)
      *H05K 1/00*         (2006.01)
      *H01L 21/56*         (2006.01)
      *H01L 23/31*         (2006.01)
      *H01L 23/538*       (2006.01)
      *H01L 25/065*       (2006.01)

(52) U.S. Cl.
      CPC ...... *H01L 21/4864* (2013.01); *H01L 21/4867* (2013.01); *H01L 21/56* (2013.01); *H01L 23/12* (2013.01); *H01L 23/3128* (2013.01); *H01L 23/4985* (2013.01); *H01L 23/49816* (2013.01); *H01L 23/49827* (2013.01); *H01L 23/49833* (2013.01); *H01L 23/49838* (2013.01); *H01L 23/5384* (2013.01); *H01L 23/5385* (2013.01); *H01L 23/5386* (2013.01); *H01L 23/5387* (2013.01); *H01L 24/32* (2013.01); *H01L 25/0655* (2013.01); *H05K 1/00* (2013.01); *H01L 24/08* (2013.01); *H01L 2224/08235* (2013.01); *H01L 2224/3223* (2013.01); *H01L 2224/32235* (2013.01); *H01L 2224/838* (2013.01); *H01L 2224/83013* (2013.01); *H01L 2224/83031* (2013.01); *H01L 2224/83039* (2013.01); *H01L 2224/8385* (2013.01)

(58) Field of Classification Search
      CPC ........... H01L 23/49833; H01L 23/5384; H01L 23/5385; H01L 23/5386; H01L 23/5387; H01L 25/0655; H01L 23/12; H01L 21/4853; H01L 21/486; H01L 21/4867; H01L 23/49827; H01L 23/49838; H01L 23/4985; H01L 24/32; H01L 24/08; H01L 2224/08235; H01L 2224/838; H01L 2224/3223; H01L 2224/83013; H01L 2224/83031; H01L 2224/83039; H01L 2224/8385; H01L 2924/15173; H01L 24/05; H01L 24/29; H01L 24/82; H01L 24/92; H01L 2224/24225; H01L 24/24; H01L 2224/32225; H01L 2224/83191; H01L 2224/92144; H01L 23/49894; H05K 1/00
      See application file for complete search history.

(56) References Cited

U.S. PATENT DOCUMENTS

| | | | | |
|---|---|---|---|---|
| 6,051,093 | A | * 4/2000 | Tsukahara | ............. H01L 21/563 156/251 |
| 6,297,141 | B1 | * 10/2001 | Miyazaki | .......... H01L 23/49827 257/773 |
| 9,480,162 | B2 | 10/2016 | Hossain et al. | |
| 2003/0137056 | A1 | * 7/2003 | Taniguchi | ............. H05K 1/115 257/774 |
| 2008/0196930 | A1 | 8/2008 | Tuominen et al. | |

OTHER PUBLICATIONS

Search Report and Written Opinion for PCT/CN2017/076430 dated Sep. 1, 2017 including translation.

* cited by examiner

CHIP WIRING METHOD AND STRUCTURE

TECHNICAL FIELD

The present disclosure belongs to the field of electronics, and in particular relates to a chip connection method (chip wiring method) and structure.

BACKGROUND ART

In a conventional integrated circuit system, a chip is required to be mounted, after being separately packaged, onto a circuit board together with other electronic components. The chip is connected to a circuit port of a substrate by means of wire bonding or flip-chipping, and then connected to the substrate, resulting a large amount of various materials used, complicated process and high production cost. Moreover, use of a large amount of materials with different characteristics may easily induce multiple thermo-mechanical stress problems at the interfaces of the materials.

Also, inter-chip data communication and circuit connections between the chip and other electronic components are required to be realized through the chip pins and electronic device pins as well as the circuits inside the circuit board. Sufficient space must be left between the chips and between the chips and other electronic components, and the geometric dimension of the entire system is constrained, resulting in that the system cannot be sufficiently miniaturized.

The connection density is limited by the spacing between the chip pins, and density/pitch of chip pins cannot be improved.

SUMMARY

Based on this, the present disclosure, aiming to overcome the defects of the prior art, provides a chip connection method and a chip connection structure, in which the connection lines avoid the blocking of the chip pins, so as to obtain chip pins and connection lines of high density, thus increasing the number of connection nodes for the chip and improving the data transmission rate of the chip.

Its technical solutions are as follows:

A connection method for a chip includes: providing a first connection line and a second connection line at a substrate, wherein a distance between the first connection line and the chip is smaller than a distance between the second connection line and the chip in a thickness direction of the substrate; and providing the chip at a top surface of the substrate, wherein the chip is provided with at least two chip pins, the substrate is provided with a second through hole, the through hole is corresponding to the first connection line, the second through hole is provided therein with a second conductive layer, wherein at least one of the chip pins is electrically connected to the first connection line, and at least one of the remaining chip pins is corresponding to an first opening of the second through hole, and the second conductive layer enables the chip pin to be electrically connected to the second connection line.

In one embodiment, the substrate is provided with a third connection line and a third through hole, and the distance between the third connection line and the chip is greater or smaller than the distance between the second connection line and the chip in the thickness direction of the substrate, a third conductive layer is provided in the third through hole, and the second connection line is in number of at least one, wherein the at least one second connection line has one end corresponding to the second through hole and electrically connected to the chip pins through the second conductive layer, and the other end corresponding to the third through hole and electrically connected to the third connection line through the third conductive layer.

In one embodiment, during the process of fabricating the second conductive layer in the second through hole through the second opening of the second through hole, the second conductive layer is fed into the second through hole from the second opening of the second through hole.

In one embodiment, the second conductive layer is of a soldered ball, or a solder paste, or a conductive paste; or the second conductive layer is a metal layer, with the metal layer formed by an immersion gold method, a sputtering method, or an electroplating method.

In one embodiment, a conductive bonding material is provided in the second through hole by screen printing.

In one embodiment, an adhesive film is provided between the chip and the substrate, and the adhesive film makes the chip adhered/bonded to the substrate.

In one embodiment, an additional through hole is formed in the adhesive film through the second opening of the second through hole by laser melting or plasma cleaning or by using a chemical solvent. The additional through hole makes the second through hole engaged with the chip pin. The second conductive layer extends into the additional through hole.

In one embodiment, a protective layer is provided on an inner wall of the second through hole, and the protective layer is used to protect the substrate when the additional through hole is formed.

In one embodiment, the substrate is provided with a first through hole, the first connection line is corresponding to the first through hole, and the first through hole is provided therein with a first conductive layer, and the first conductive layer enables the first connection line to be electrically connected to the chip pin.

In one embodiment, the substrate is a flexible circuit board; or the substrate comprises at least two layers of flexible circuit boards stacked.

A chip connection structure includes: a chip provided on a top surface of the substrate, the substrate being provided with a first connection line and a second connection line, wherein in a thickness direction of the substrate, the distance between the first connection line and the chip is smaller than the distance between the second connection line and the chip, the chip is provided with at least two chip pins, the substrate is provided with a second through hole, and the second through hole is corresponding to the second connection line, the second through hole is provided therein with a second conductive layer, wherein at least one of the chip pins is electrically connected to the first connection line, and at least one of the remaining chip pins is corresponding to the second through hole, and the first conductive layer makes the chip pin electrically connected to the second connection line.

In one embodiment, the substrate is provided with a first through hole, the first connection line is corresponding to the first through hole, the first through hole is provided therein with a first conductive layer, and the first conductive layer makes the first connection line electrically connected to the chip pin.

In one embodiment, the substrate is provided with a third connection line and a third through hole, a third conductive layer is provided in the third through hole, and in a thickness direction of the substrate, the distance between the third connection line and the chip is greater than the distance between the second connection line and the chip, and the second connection line is in number of at least one, wherein at least one of the second connection lines has one end corresponding to the first through hole, and the other end corresponding to the second through hole, and the second connection line has one end electrically connected to the chip pin through the second conductive layer, and the other end electrically connected to the third connection line through the third conductive layer.

In one embodiment, the chip, the first connection line and the third connection line are provided at a top surface of the substrate, and the second connection line is provided at a bottom surface of the substrate.

In one embodiment, the chip and the first connection line are provided at a top surface of the substrate, and the second connection line is provided at a bottom surface of the substrate.

In one embodiment, the substrate is a flexible circuit board; or the substrate comprises at least two layers of flexible circuit boards stacked.

The beneficial effects of the present disclosure include the followings.

1. A chip connection method includes: providing a first connection line and a second connection line at a substrate, wherein the first connection line and the second connection line may be provided at the top surface of the substrate or the bottom surface of the substrate, or embedded inside the substrate. In the thickness direction of the substrate, the distance between the first connection line and the chip is smaller than the distance between the second connection line and the chip. Similar to providing a first connection line and a second connection line at a substrate in a layering manner, the second connection line and the first connection line do not interfere with each other, and the first connection line and the second connection line are located in two "layers" in the thickness direction of the substrate, as shown in FIGS. 14-15.

The chip is provided at the top surface of the substrate, wherein the chip may be bonded to the substrate or not. The chip is provided with at least two chip pins, and the chip pins of the chip include, but not limited to, a connection portion led out from inside of the chip, and the extension pin electrically connected to the connection portion, as long as it is possible to be electrically connected to the chip through the chip pin.

The substrate is provided with a second through hole, wherein the second through hole is corresponding to the second connection line, a second conductive layer is provided inside the second through hole, and a portion of the second connection line is located near the opening of the second through hole or extends into the second through hole, so that the second connection line may be electrically connected to the second conductive layer, wherein at least one of the chip pins is electrically connected to the first connection line, and at least one of the remaining chip pins is corresponding to a first opening of the second through hole, and the first conductive layer makes the chip pin electrically connected to the second connection line.

First, the chip pin is connected to the second connection line through the second conductive layer in the second through hole, and the second conductive layer is provided through the second opening of the second through hole, so as to provide the chip from blocking the chip pins, enabling the second through hole and the chip pin to be accurately positioned, thereby improving the connection precision, achieving batch production of the second through holes and setting a plurality of chips in batches, and greatly improving production efficiency. The second conductive layer is provided in the second through hole without occupying extra space, thus the overall volume after packaging can be greatly reduced. In particular, for the case of using a flexible circuit board as the substrate, after the above steps are completed, the while still remains flexible, which is a large advantage.

Secondly, the chip is mounted on the top surface of the substrate, wherein the area covered by the chip on the substrate is referred to as a "shadow area". The pins of the chip are located in the shadow area, and the chip pins have to escape from the shadow area, so as to be connected externally. In the conventional way, all the connection lines are provided at the top surface of the substrate, and the chip pins may escape only from the top surface of the substrate. At this time, the connection lines need to pass through the gap between the chip pins and to avoid the chip pins, resulting in that sufficient space needs to be left between the chip pins for allowing the connection lines to pass therethrough, as shown in FIG. 17, which limits the number of the connection lines and does not allow more connection lines. Also, if the number of chip pins is large, the chip pins near the edge of the chip can be led out, but there is no space for providing connection lines to make the chip pins near the middle of the chip led out, so the traditional connection method limits the density of the connection lines and the density of the chip pins. However, in the present disclosure, the chip pins escape respectively through the first connection line and the second connection line, and the first connection line and the second connection line are located in different thickness layers in the thickness direction of the substrate, and the two do not interfere with each other. Some of the chip pins escape through the first connection line. The other part of the chip pin escapes through the second connection line, that is, the chip pins can escape through the two "layer" of planes, increasing the density of the chip pins.

For the chip pins that escape through the second connection line, in the shaded area, the chip pins first escape through the second conductor layer in the second through hole to the layer where the second connection line is located, and then escape from the second connection line, so that some of the chip pins, after escaping to the second connection line, are externally connected from the layer where the second connection line is located. The number of connection lines that escape from the top surface of the substrate is reduced, and more connection lines can be arranged, and even when the line widths of the connection lines are appropriately increased, the number of connection lines does not decrease. The second connection line does not need to pass through the gap between the chip pins, and the chip pins escape through the second through hole from the dense chip pins surrounding thereof to the layer where the second connection line is located, avoiding the mutual blocking among the multiple chip pins, and obtaining connection lines with higher density. Similarly, chip pins with higher density can be set, and the chip can obtain connection nodes with higher density, improving the data transmission speed of the chip. Using the chip connection method and structure of the present disclosure, a part of the chip pins directly escapes from the shadow area through the second through hole to the second connection line, and chip pins with higher density can be fabricated on the chip to thereby obtain more connection nodes.

However, in the thickness direction of the substrate, it is not limited to two "layers". Based on different wiring requirements, three "layers", four "layers" or more "layers" may be provided, so that the chip pins can escape respectively through more "layers", making the setting of the connection lines more flexible, thus obtaining more connection nodes and connection lines.

2. The substrate is provided with a third connection line and a third through hole, wherein the third through hole is provided therein with a third conductive layer, and in the thickness direction of the substrate, the distance between the third connection line and the chip is greater than or less than the distance between the second connection line and the chip, the second connection line is not in the same "layer" as the third connection line, and the third connection line may be in the same "layer" as the first connection line, or may not be in the same "layer", and when the third connection line is not in the same "layer" as the first connection line, the first connection line, the second connection line and the third connection line form three "layers".

A third conductive layer is provided in the third through hole, wherein there is at least one second connection line, wherein the at least one second layer has one end corresponding to the second through hole and electrically connected to the chip pin through the second conductive layer, and the other end corresponding to the third through hole and electrically connected to the third connection line through the third conductive layer. The chip pin and the third connection line may be electrically connected to each other through the second connection line, and the chip pin escapes through the second through hole from the dense chip pin to the layer where the second connection line is located, and escapes through the third through hole to the layer where the third connection line is located. Designing the layers where the third connection line and the second connection line are located and the wiring pattern as required can help the chip pins escape out as much as possible to obtain the connection, thereby increasing the density of the chip pins, improving the density of the connection nodes of the chip, and further increasing the data transmission speed of the chip.

Preferably, the chip, the first connection line and the third connection line are provided on a top surface of the substrate, and the second connection line is provided on a bottom surface of the substrate, a metal layer is coated on the top surface and the bottom surface of the substrate, and then the first connection line, the second connection line and the third connection line are simultaneously formed by using a photoresist, improving production efficiency.

3. During the process of fabricating the second conductive layer in the second through hole through the second opening of the second through hole, the conductive bonding material is fed into the second through hole through the second opening of the second through hole, so that the conductive bonding material is adhered to the inner wall of the second through hole and the device pins to constitute the second conductive layer. By feeding the conductive bonding material from the second opening, it is possible to perform operation on the bottom surface of the substrate, without being blocked by the chip. By using the conductive bonding material, in the second through hole, the chip at the top is firmly bonded to the substrate, to prevent the device from falling off and simultaneously forming a conductive path from the chip pin to the second conductive layer to obtain a good electrical connection performance.

4. The conductive bonding material is of a soldered ball, or a solder paste, or a conductive paste, or a conductive metal paste. One or more combinations may be selected according to the process needs or the material of the substrate, the size of the inner wall of the second through hole and the nature of the surface material. The process of placing a conductive adhesive material to form a conductive connecting path may use common soldering processes, including steps such as surface cleaning, flux spraying, precise placement of soldered balls using a ball placing machine and heat treatment; or may use more special chemical surface cleaning, surface treatment, precise spraying of solder paste, conductive paste or conductive metal paste, and then a heat treatment to form mechanical and electrical connections.

5. The conductive bonding material is provided in the second through hole by screen printing during the process of forming the second conductive layer in the second through hole through the second opening of the second through hole, which uses universal equipment and can be synchronized with the production of the circuit layer, saving process flow and further reducing costs.

6. An adhesive film is provided between the chip and the substrate, and the adhesive film makes the chip adhered to the substrate. By adhering using the adhesive film and attaching the chip to the substrate, the chip can be fixed onto the substrate, which saves steps, improves efficiency and reduces cost. The adhesive film can be insulated such that the chip pins can be electrically insulated from the connection lines on the top surface of the substrate even if connection lines are provided on the top surface of the substrate.

7. During the process of forming the second conductive layer in the second through hole through the second through hole, the additional through hole is provided in the adhesive film through the second opening of the second through hole, by laser melting or plasma cleaning, or using a chemical solvent. The additional through hole makes the first through hole engaged with the device pin. The second conductive layer extends into the additional through hole to prevent the adhesive film from blocking the electrical connection of the chip pins, the second conductive layer, and the second connection lines.

8. A protective layer is provided on an inner wall of the second through hole, and the protective layer is used to protect the substrate when the additional through hole is formed. The additional through hole can be made by using the process of, but not limited to, chemical etching or drilling, which requires to pass through the second through hole, thus the inner wall of the second through hole may be damaged, damaging the substrate. A protective layer may protect the inner wall of the second through hole from damage. Further, the protective layer may be a material that facilitates electrical connection of the second conductive layer, and the protective layer may be in electrical contact with the second connection line to facilitate electrical connection between the second connection line and the second conductive layer. For example, the protective layer may be a metal film which is pre-sputtered or evaporated on the inner wall of the second through hole, so that during the chemical etching process, the material of the inner wall of the second through hole is protected from being exposed to the etching solvent or ions, and such a thin metal layer can also increase the conductivity of the second conductive layer that is subsequently plated in the second through hole.

9. The substrate is provided with a first through hole, the first connection line is corresponding to the first through hole, a first conductive layer is provided in the first through hole, and the first conductive layer makes the first connection line electrically connected to the chip pin. The manner of making the chip pin electrically connected to the second connection line through the second through hole achieve a "hole connection", and the chip pin and the first connection line may be electrically connected to each other through the first through hole in a manner similar to the foregoing "hole connection". The chip pins escape respectively through the first through hole and the second through hole to layers where the first connection line and the second connection line are located, for electrical connection, and the first connection line and the second connection line form two "layers" in the thickness direction of the substrate. But it is not limited thereto, it is also possible to set three or more than three connection line "layers". Through the manner of "hole connection", the chip pins is electrically connected to the connection lines in the third, fourth, . . . , n layers, allowing more chip pins to escape from the chip pins surrounding thereof for electrical connection, thereby increasing the density of the chip pins and increasing the chip data transmission speed.

10. The substrate is a flexible circuit board; the chip pins are led out and then connected by means of "hole connection", which can increase the density of the chip pins, thereby reducing the volume of the chip; and the first conductive layer and the second conductive layer are respectively located in the first through hole and the second through hole, without occupying an extra volume, and even there is no need to leave gap between the chip and the substrate (but not limited thereto, a gap may be also set as needed, such as an adhesive layer), which may reduce the total thickness of the chip and the substrate and can maintain, when the substrate is a flexible circuit board or a multilayer flexible circuit board, the overall flexibility for a wearable device or the like. Preferably, when the substrate comprises at least two layers of flexible circuit boards which are stacked, if two or more "layers" are provided, the first connection line, the second connection line or other connection lines may be set between two adjacent layers of flexible circuit boards firstly.

11. The chip and the first connection line are provided on a top surface of the substrate, and the second connection line is provided on a bottom surface of the substrate. A metal layer is coated on the top surface and the bottom surface of the substrate, and then the first connection line and the second connection line are simultaneously formed by using a photoresist to improve production efficiency.

DESCRIPTION OF THE REFERENCE SIGNS 100, substrate, 101, base sheet, 110$a$, 110$b$, circuit layer, 120$a$, 120$b$, connection through hole, 120$c$, first opening, 120$d$, second opening, 121$a$, 121$b$, protective layer, 200, device, 210$a$, 210$b$, 210$c$, device pin, 300, insulating medium, 400$a$, 400$b$, conductive layer, 500, conductive connection port, 201, chip, 211$a$, 211$b$, 211$c$, chip pin, 111$a$, 111$c$, second connection line, 111$b$, first connection line, 111$d$, third connection line, 121$a$, 121$c$, second through hole, 121$b$, first through hole, 121$d$, third through hole, 401$a$, 401$c$, second conductive layer, 401$b$, first conductive layer, 401$d$, third conductive layer.

DETAILED DESCRIPTION OF EMBODIMENTS

The present disclosure will be further described in detail below, but embodiments of the disclosure are not limited thereto.

First Embodiment

Figure 4:
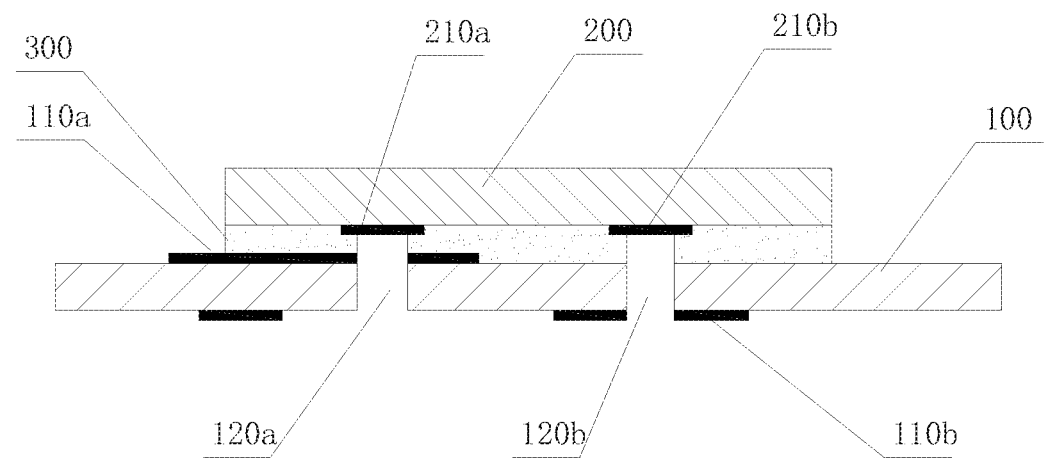
FIG. 4 is a fourth schematic diagram of a chip connection method according to First Embodiment of the present disclosure.

In this embodiment, as shown in FIG. 4, the integrated package circuit includes: a device 200 and a substrate 100. The device 200 is mounted on the top surface of the substrate 100. The top surface and the bottom surface of the substrate 100 are respectively provided with circuit layers 110$a$ and 110$b$. The insulating medium 300 is provided between the device 200 and the substrate 100 (in the embodiment, the insulating medium 300 is simultaneously also an adhesive film). The device 200 is provided with device pins 210$a$, 210$b$, the device pins 210$a$, 210$b$ are oriented facing the substrate 100, the circuit layers 110$a$, 110$b$ are provided with circuit pins, and the substrate 100 is provided with connection through holes 120$a$, 120$b$, the connection through holes 120$a$, 120$b$ are engaged with the circuit pins, the first opening 120$c$ of the connection through holes 120$a$, 120$b$ is engaged with the device pins 210$a$, 210$b$, the second opening 120$d$ of the connection through holes 120$a$, 120$b$ is an operation window, and the insulating medium 300 (adhesive film) is provided with an additional through hole communicating with the first openings 120c of the connection through holes 120a, 120b. The connection through holes 120a, 120b are provided therein with conductive layers 400a, 400b, and the conductive layers 400a, 400b extend into the additional through hole to be electrically connected to the device pins 210a, 210b. In the above, the insulating medium 300 separates the device 200 from the substrate 100. The insulating medium 300 (adhesive film) can prevent the device 200 from affecting the circuit layers 110a, 110b or other conductive structures on the top surface of the substrate 100. The number of device pins 210a, 210b of the device 200 can be set as needed. When the device pins 210a, 210b of the device 200 are in number of two or more, some of the device pins 210a, 210b are connected with the substrate 100 or the circuit layers 110a, 110b through the integrated circuit packaging method of the present disclosure. The insulating medium 300 can prevent the additional device pins 210a, 210b from affecting the substrate 100 or the circuit layers 110a, 110b. In the present embodiment, the insulating medium 300 is also an adhesive film, and the insulating medium 300 (adhesive film) bonds the device 200 to the substrate 100. The device 200 is placed on the substrate 100 by means of bonding, and the process of placing the device 200 is on the substrate 100 can fix the device 200 to the substrate 100, thereby saving steps, improving efficiency and reducing cost. However, it may be the case that the insulating medium 300 only plays a role of isolating the device 200 from the substrate 100, and the device 200 is fixed to the substrate 100 by another method, or it may also be the case that an adhesive film may be used to adhere the device 200 to the substrate 100, but the adhesive film does not play the role of isolating the device 200 from the substrate 100.

Figure 1:
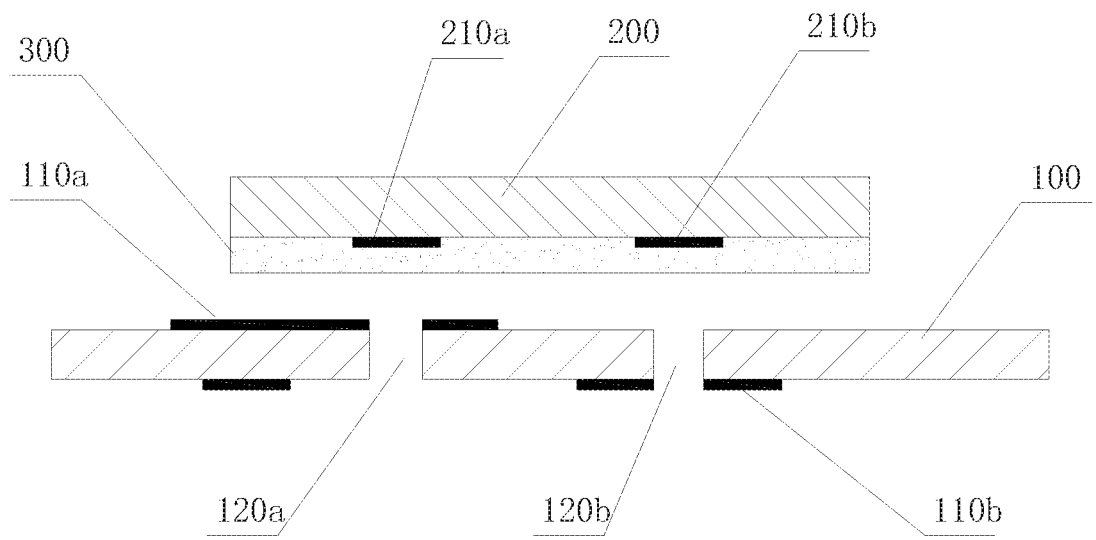
FIG. 1 is a first schematic diagram of a chip connection method according to First Embodiment of the present disclosure.

In this embodiment, the integrated circuit packaging method includes: as shown in FIG. 1, providing circuit layers 110a and 110b on the top surface and the bottom surface of the substrate 100 respectively, wherein the circuit layers 110a and 110b have circuit pins, and the circuit pins may be connection portions directly led out from the circuit layers 110a and 110b, or may be extension pins electrically connected to the connection portions, as long as it is possible to be electrically connected to the circuit layers 110a and 110b through circuit pins. The device pins 210a, 210b of the device 200 each include, but not limited to, a connection portion led out from inside of the device 200 and an extension pin electrically connected to the connection portion, as long as it is possible to be electrically connected to the device 200 the device pins 210a, 210b. The device pins 210a, 210b are engaged with the first openings 120c of the connection through holes 120a, 120b.

Figure 2:
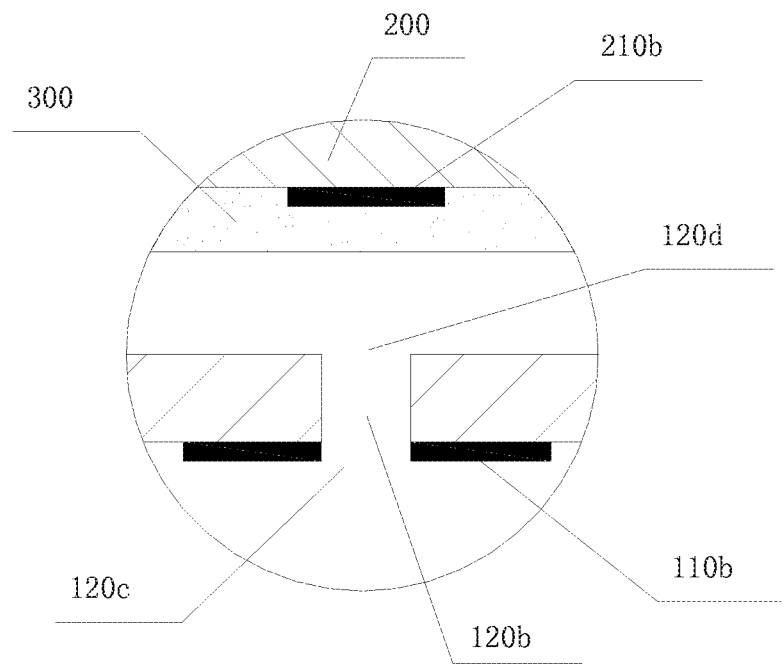
FIG. 2 is a second schematic diagram of a chip connection method according to First Embodiment of the present disclosure.

As shown in FIG. 2, one surface of the device 200, on which the device pins 210a and 210b are provided, is coated with an adhesive film (not limited to this embodiment, the adhesive film may be applied to the substrate 100), one surface of the device 200 having device pins 210a and 210b faces the substrate 100, and the device 200 is placed on the substrate 100. At this time, the adhesive film enables the device 200 to be mounted on the substrate 100. (In the embodiment, the adhesive film is at the same time the insulating medium 300, and is not limited to the embodiment, the adhesive film may not be used to bond the device 200)

Figure 3:
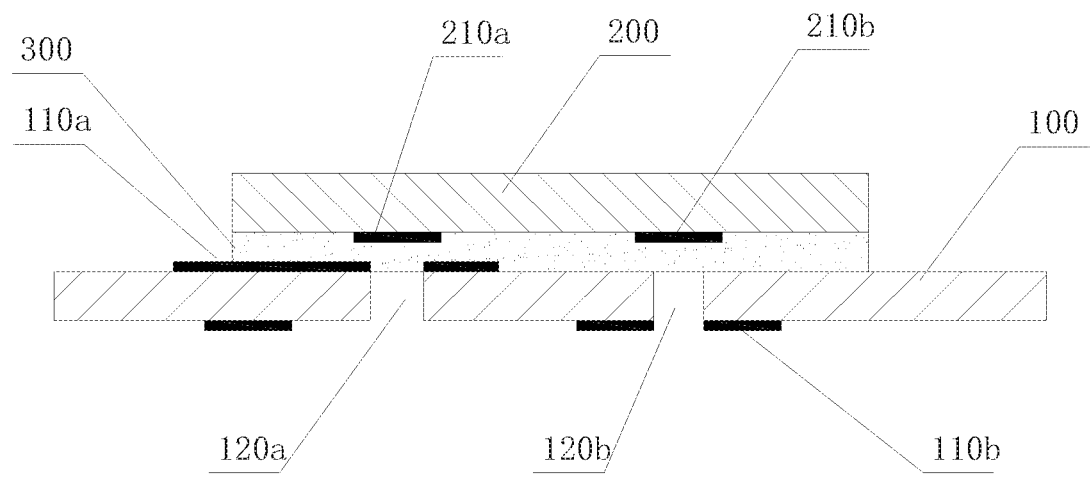
FIG. 3 is a third schematic diagram of a chip connection method according to First Embodiment of the present disclosure.
Figure 8:
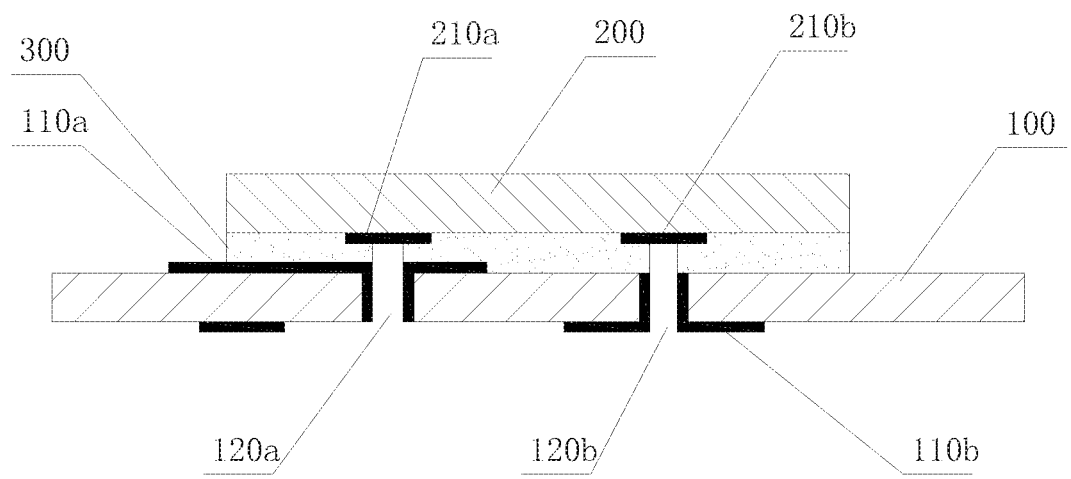
FIG. 8 is a third schematic diagram of a chip connection method according to Second Embodiment of the present disclosure.

As shown in FIG. 3, connection through holes 120a, 120b are formed on the substrate 100, to make the device pins 210a, 210b engaged with the first openings 120c of the connection through holes 120a, 120b, and the second opening 120d of the connection through holes 120a, 120b may allow to form the conductive layers 400a, 400b in the connection through holes 120a, 120b. The structures of the first opening 120c and the second opening 120d are as shown in FIG. 8. The device pins 210a, 210b are located on the top surface of the substrate 100. Through the second openings 120d of the connection through holes 120a, 120b, the device 200 may be electrically connected to the circuit layers 110a, 110b from the bottom surface of the substrate 100, preventing the device 200 from shielding the device pins 210a, 210b from above. Through the second openings 120d of the connection through holes 120a, 120b, an additional through hole is formed in the adhesive film by laser melting or plasma cleaning, or using a chemical solvent, wherein the additional through hole enables the connection through holes 120a, 120b to be engaged with the device pins 210a, 210b, preventing the adhesive film from impeding the electrical connection of device pins 210a, 210b, conductive layers 400a, 400b, and circuit pins.

As shown in FIG. 4, conductive layers 400a, 400b are formed in the connection through holes 120a, 120b through the second openings 120d of the connection through holes 120a, 120b, the conductive layers 400a, 400b extends into the additional through holes, and the conductive layers 400a, 400b makes the device pins 210a, 210b electrically coupled to circuit pins.

Packaging according to the above method can reduce the cost of the integrated circuit package and save packaging time. Moreover, the overall thickness of the substrate 100 and the device 200 is reduced, and even no gap is required between the substrate 100 and the device 200 (in principle, no gap is required to be left, but other materials may be provided on the substrate 100 and the device 200 as needed); no steps of heating and welding are required, which can avoid, especially for packaging of ultra-thin devices 200 (such as ultra-thin chips) and flexible circuit board, the overall thermo-mechanical stress distribution of the system caused by relatively large temperature changes, and influence on the performance of device 200.

In addition, after the conductive layers 400a and 400b are formed, a package layer is provided on the substrate 100, and the device 200 is packaged by the package layer and the substrate 100. Alternatively, after the device 200 is placed on the substrate 100 and before the conductive layers 400a and 400b are formed, the package layer is provided on the substrate 100, and two devices 200 are packaged by the package layer and the substrate 100. Use of the package layer to package the device 200 may protect the device 200, and the package layer can cover the substrate 100. The package layer can be simultaneously provided on the top surface and the bottom surface of the substrate 100, to protect the substrate 100 and the circuit layers 110a, 110b on the substrate 100, so as to avoid the impact of environmental factors. At the same time, the package layer also makes the device 200 fixed to the substrate 100, without the need for additional procedures to fix the device 200. In addition, the cured package layer also becomes a better support plate for the entire system, and can be subjected to subsequent processes on the substrate after flipped.

In the above, the connection through holes 120a, 120b are engaged with the device pins 210a, 210b, and the device pins 210a, 210b are at least partially located adjacent to the first opening 120c of the connection through holes 120a, 120b or deeply inserted into the connection through holes 120a, 120b, such that the conductive layers 400a, 400b can be electrically coupled to the device pins 210a, 210b; the circuit pins are engaged with the connection through holes 120a, 120b, the circuit pins being at least partially located near the first opening 120c or the second opening 120d of the connection through holes 120a, 120b, or near the inner wall of the connection through holes 120a, 120b, so that the conductive layers 400a, 400b can be electrically connected to the circuit pins; the device 200 can be a chip or electronic component (including but not limited to resistor, capacitor) or other electronic device (including but not limited to antenna). The device 200 may be fixed to the substrate 100 through the connection through holes 120a, 120b and the conductive layers 400a, 400b, or the device 200 may be fixed to the substrate 100 by other means (including, but not limited to, pasting or molded plastic packaging).

Figure 9:
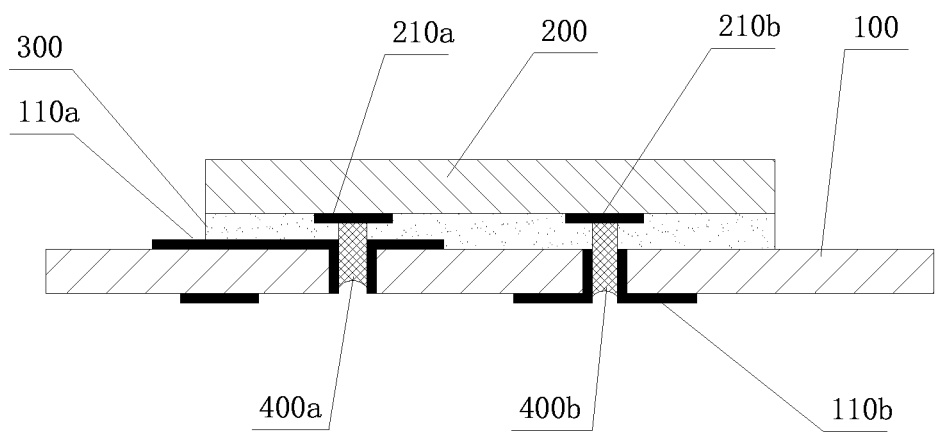
FIG. 9 is a fourth schematic diagram 4 of a chip connection method according to Second Embodiment of the present disclosure.

In the above, during the process of forming the conductive layers 400a, 400b in the connection through holes 120a, 120b through the second openings 120d of the connection through holes 120a, 120b, the conductive layers 400a, 400b are formed by electroplating, and the finally formed conductive layer 400a, 400b can be referred to FIGS. 4 and 9, wherein good electrical conductivity can be obtained, and electroplating allows control of the thickness of the conductive layers 400a, 400b, achieving desired electrical conductivity. However, the present disclosure is not limited thereto, and the conductive bonding material may be fed into the connection through hole 120a, 120b from the second opening 120d of the connection through hole 120a, 120b, during the process of forming the conductive layers 400a and 400b in the connection through holes 120a and 120b through the second openings 120d of the connection through holes 120a and 120b, so that the conductive bonding material is bonded to the inner walls of the connection through holes 120a, 120b and the device pins 210a, 210b, to form the conductive layers 400a, 400b. By feeding the conductive bonding material from the second opening 120d, operations may be carried out at the back surface of the substrate 100, without being disturbed by the device 200, and by adhering the conductive bonding material to the inner wall of the connection through holes 120a, 120b and device pins 210a, 210b of the device 200 through bonding, mechanical and electrical connections may be formed at the same time after appropriate heating or chemical treatment, and also the stable conductive connection performance is ensured. The conductive bonding material is of a soldered ball, or a solder paste, or a conductive paste, or a conductive metal paste. The finally formed conductive layers 400a, 400b can be referred to FIG. 13. One or more combinations may be selected according to the process requirements or the material of the substrate 100 and the property of the inner wall of the connection through holes 120a, 120b. Alternatively, in the process of forming the conductive layers 400a, 400b in the connection through holes 120a, 120b through the second openings 120d of the connection through holes 120a, 120b, a conductive bonding material is provided inside the connection through holes 120a, 120b by screen printing. Screen printing is a common manufacturing method of the circuit layers 110a and 110b. The conductive layers 400a and 400b are formed by screen printing, which uses universal equipment and can be synchronized with the fabrication of the circuit layers 110a and 110b, saving the process flow and further reducing the cost.

Further, a plurality of devices 200 can be simultaneously mounted on a large panel of a large area, and the batch processing on the large panel further reduces the cost and saves the packaging time. In mass production, a carrier of a large flat plate is used, a plurality of sets of devices 200 are arranged on the carrier, the carrier is covered on the top surface of the substrate 100, and the device 200 is adhered to the substrate 100 using an adhesive film, the carrier is separated from the device 200 (the device 200 may be mounted onto the carrier by using a photosensitive or heat sensitive material, so that the carrier is separated from the device 200 by changing the temperature or illumination), and after the package is completed, the substrate 100 is finally cut into a plurality of sub-boards according to a predetermined grouping, with each sub-board corresponding to a set of devices 200 and each sub-board being independent. In this way, packaging operations can be performed in a large batch, and production efficiency is greatly improved. (where the adhesive film may be an insulating material at the same time)

In this embodiment, the top surface and the bottom surface of the substrate 100 are respectively provided with circuit layers 110a and 110b, and the chip is electrically connected to the circuit layers 110a and 110b at the same time. However, it is not limited thereto, it may be the case that the circuit layers 110a, 110b are embedded in the substrate 100, and the device pins 210a, 210b are electrically connected to the circuit layers 110a, 110b; or it may be the case that the top surface of the substrate 100 is provided with circuit layers 110a, 110b, or/and the bottom surface of the substrate 100 is provided with circuit layers 110a, 110b, or/and the substrate 100 is provided therein with circuit layers 110a, 110b, and the device pins 210a, 210b are in number of at least two, wherein one of the device pins 210a, 210b is electrically connected to at least one of the circuit layers 110a, 110b, and the other of the device pins 210a 210b is electrically connected to the remaining one of the circuit layers 110a, 110b. The substrate 100 is provided with two or more circuit layers 110a and 110b. The device 200 is electrically connected to at least two different circuit layers 110a and 110b through different device pins 210a and 210b, to expand the circuit function.

In this embodiment, the substrate 100 may be a flexible circuit board; or the substrate 100 may include at least two layers of flexible circuit boards which are stacked. Through the integrated circuit packaging method, the device 200 is mounted onto the substrate 100 and the electrical connection between the device 200 and the circuit layers 110a and 110b on the substrate 100 is realized. The overall thickness of the device 200 and the substrate 100 is small, and the overall flexibility can be maintained for wearable devices, etc.

In the above, the device 200 is a chip or an electronic component. The integrated circuit packaging method is suitable for packaging of chips or electronic components, wherein the electronic components include, but not limited to, independent resistors, capacitors, inductors, diodes, or transistors, and the chips include, but not limited to, die, wafer, or packaged integrated chip. Chips or electronic components can be packaged using the same equipment and process flow, reducing costs.

In the above, FIGS. 1 to 4 illustrate only the structure of the single device 200, but not limited thereto, and the device 200 may be in number of at least two. The integrated circuit packaging method is applicable to two or more devices 200. Further, operations may be performed on two or more devices 200 simultaneously, and the above devices 200 are mounted onto the substrate 100 to implement electrical connection of the device 200 and the circuit layers 110a, 110b, improving efficiency and reduce costs. When the device 200 is in number of at least two, it may be the case that at least two devices 200 include at least one chip and at least one electronic component. Chips and electronic components can be packaged at the same time to increase efficiency and reduce costs. When providing a package layer on the substrate 100, it is optional to package a single device 200 or package two or more devices 200. The purpose of the package layer is mainly to protect the device 200 from being affected by external environmental factors such as the influence of water vapor and electromagnetic radiation on the electrical properties of the device. At the same time, it also makes the relative positions of the plurality of devices 200 on the substrate 100 fixed to ensure the stability of the electrical connection. In this disclosure, after the package layer is cured, the package layer is further used as a support plate, so that we can then conveniently fabricate the conductive layer on the inner wall of the connection through hole on the substrate 100. In addition, two or more package layers may be provided on one substrate 100, and the package layers may have a gap between each other to provide a larger curvature, so that the whole of the substrate 100, the device 200, and the package layer is more flexible. In particular, when the substrate 100 is a flexible circuit board or formed by two or more layers of flexible circuit boards, the integrated package circuit can maintain such flexibility, so that the integrated package circuit can be applied to, for example, occasions needing to remain flexibly, such as a wearable device.

In the above, the circuit layers 110a, 110b are functional circuits, and the circuit layers 110a, 110b have certain electronic functions; or the circuit layers 110a, 110b themselves constitute an electronic component, including but not limited to antenna. The circuit layers 110a, 110b of the integrated package circuit structure have a wide range of applications, and can realize integration of various functions.

If necessary, an auxiliary layer may be formed on the inner walls of the connection through holes 120a, 120b through the second opening 120d before the conductive layers 400a, 400b are formed, the auxiliary layer is electrically connected to the circuit layers 110a, 110b, and then conductive layers 400a, 400b are formed on the auxiliary layer. The auxiliary layer is used to assist in the fabrication of the conductive layers 400a, 400b, such that the conductive layers 400a, 400b are better electrically connected to the device pins 210a, 210b and the circuit pins, or better attached to the inner wall of the connection through holes 120a, 120b. Alternatively, protective layers 121a and 121b are provided on the inner walls of the connection through holes 120a and 120b, and the protective layers 121a and 121b are used to protect the substrate 100 when the additional through holes are formed. The additional through holes may be formed by using, but not limited to, a chemical etching or drilling process. In this case, it is necessary to pass through the connection through holes 120a, 120b, which may damage the material of the inner wall of the connection through holes 120a, 120b and further damage the substrate 100 and the circuit layers 110a, 110b. The protective layers 121a, 121b can protect the inner walls of the connection through holes 120a, 120b from damage. Further, the protective layers 121a, 121b may be materials that facilitate the electrical connection of the conductive layers 400a, 400b. At this time, the protective layers 121a, 121b may be in contact with the circuit pins to facilitate electrical connection of the circuit pins and the conductive layers 400a, 400b.

In this embodiment, the inner walls of the connecting through holes 120a, 120b are provided with protective layers 121a, 121b, and the protective layers 121a, 121b are also auxiliary layers, wherein the protective layers 121a, 121b (auxiliary layers) are not shown in the figures, referring to FIGS. 10 to 13. Further, in the present embodiment, the protective layers 121a and 121b (auxiliary layers) are made of the same material as the circuit layers 110a and 110b. For example, the circuit layers 110a and 110b are made of copper, and the protective layers 121a and 121b (auxiliary layers) are also made of copper, further improving electrical connection performance. However, the present disclosure is not limited to this embodiment, and other materials may be used as needed, and the protective layers 121a, 121b for providing protection or the auxiliary layers for auxiliary electrical connection may be separately provided. In the above, the protective layers 121a, 121b (auxiliary layers) are electrically connected to the circuit layers 110a, 110b, and the conductive layers 400a, 400b makes the device pins 210a, 210b electrically connected to the circuit pins. The protective layers 121a and 121b (auxiliary layers) are directly electrically connected to the circuit pins, the electrical connection effect is good, and the circuit pins can be extended, reducing the volume of the conductive layers 400a and 400b, facilitating the fabrication of the conductive layers 400a and 400b and facilitating cost reduction.

In this embodiment, the conductive layers 400a and 400b may be formed by electroplating, and an auxiliary layer may be formed by a sputtering or evaporating process before electroplating. The sputtered or evaporated auxiliary layer can be better electrically connected to the circuit pins, and the electroplated conductive layers 400a, 400b are attached to the auxiliary layer, which can achieve better electroplating on the one hand, and on the other hand can better realize the electrical connection between the conductive layers 400a, 400b and the circuit pins by the auxiliary layer. Moreover, sputtering, evaporating and electroplating can be simultaneously performed on all of the devices 200 on the substrate 100 to improve efficiency.

In the present embodiment, the circuit layers 110a and 110b are formed on the substrate 100 in advance, but not limited thereto, the circuit layers 110a and 110b may be formed on the substrate 100 during the integrated circuit packaging. For example, a release layer is provided at the bottom surface of the substrate 100. The release layer has a mold groove having a contour similar to that of the circuit layers 110a and 110b. After the connection through holes 120a and 120b are formed, the circuit layers 110a and 110b are formed in the mold groove while the conductive layers 400a and 400b are formed.

Taking the electroplating manufacturing method as an example, the conductive layers 400a and 400b and the circuit layers 110a and 110b are made of the same material, and while electroplating the conductive layers 400a and 400b, a conductive layer is also electroplated in the mold groove and at the surface of the release layer, and then the release layer and the conductive layers 400a, 400b at the surface thereof are removed to form the circuit layers 110a, 110b on the substrate surface. The process of forming the conductive layers 400a, 400b by electroplating further includes forming auxiliary layers in the connection through holes 120a and 120b and at the surface of the device pins 210b and 210c by sputtering or evaporation before electroplating, and then performing electroplating. The sputtered or evaporated auxiliary layer may be better electrically connected to the circuit pins, and the electroplated conductive layers 400a, 400b are attached to the auxiliary layer. Sputtering or evaporating of the auxiliary layer on the one hand can improve the quality of the electroplating, and on the other hand, can better achieve the electrical connection between the conductive layers 400a, 400b and the circuit pins.

Second Embodiment

The difference between the second embodiment and the first embodiment lies in the follows.

Figure 5:
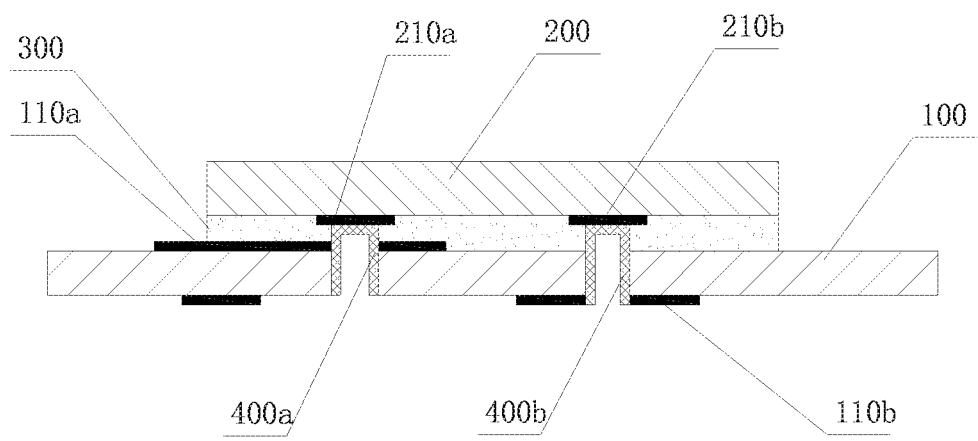
FIG. 5 is a fifth schematic diagram of a chip connection method according to First Embodiment of the present disclosure.
Figure 6:
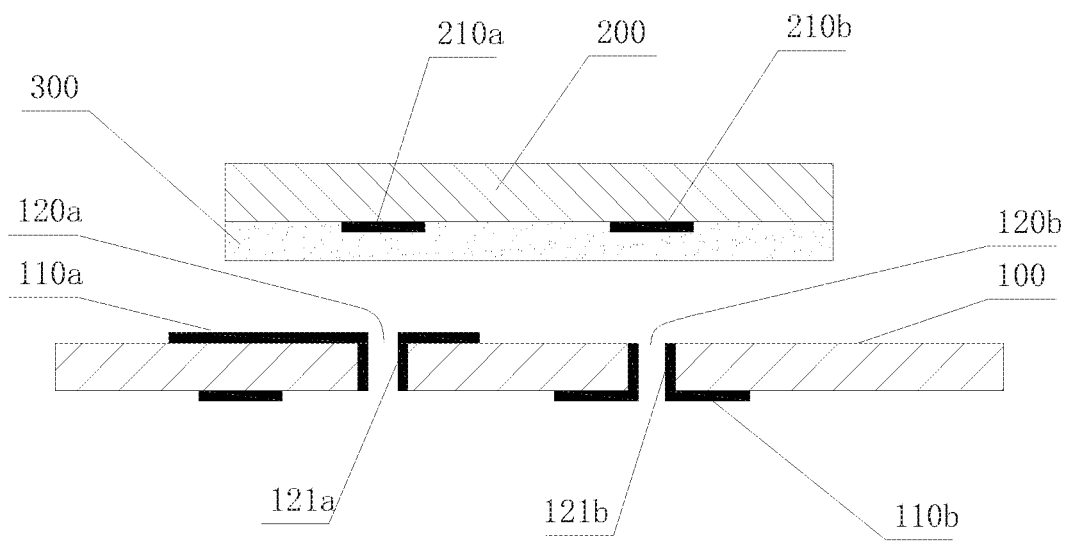
FIG. 6 is a first schematic diagram of a chip connection method according to Second Embodiment of the present disclosure.
Figure 7:
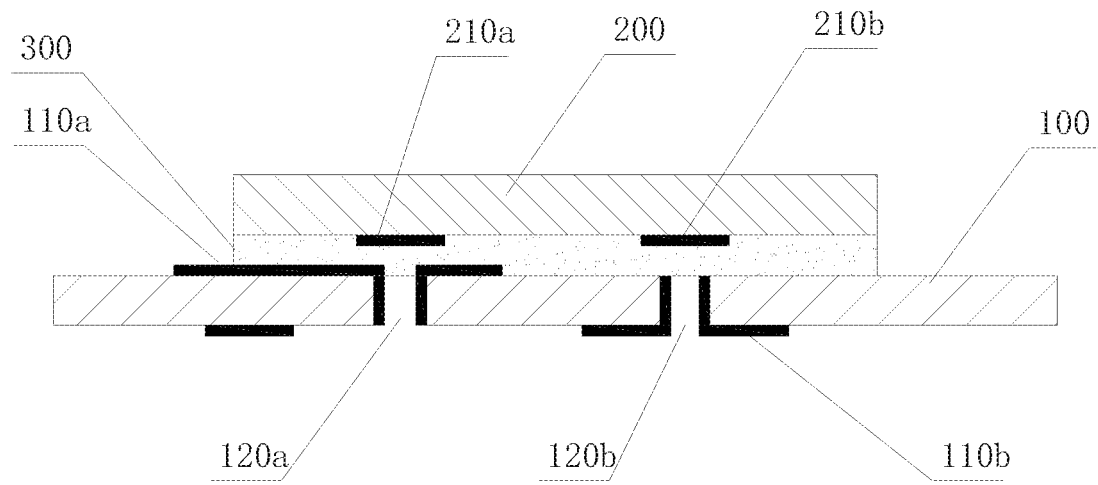
FIG. 7 is a second schematic diagram of a chip connection method according to Second Embodiment of the present disclosure.

The connection through holes 120a and 120b are formed on the substrate 100 in advance, and the device 200 is mounted onto the substrate 100. As shown in FIGS. 5-9, the specific steps comprises: the substrate 100 is provided with prefabricated connection through holes 120a, 120b. As shown in FIG. 5, the device 200 is placed on the substrate 100, so that the device pins 210a, 210b of the device 200 is engaged with the first opening 120c of the connection through hole 120a, 120b. As shown in FIG. 6, in this embodiment, an insulating medium 300 is provided between the device 200 and the substrate 100 (in this embodiment, the insulating medium 300 is also an adhesive film, and has the function of isolating the device 200 from the substrate 100 and bonding the device 200 to the substrate 100 at the same time, but not limited thereto). An additional through hole is formed in the insulating medium 300, and the additional through hole is engaged with the device pins 210a, 210b, and the first openings 120c of the connection through holes 120a and 120b. As shown in FIG. 7, the conductive layers 400a and 400b are formed in the connection through holes 120a and 120b. The conductive layers 400a and 400b deeply extend into the additional through hole, to make device pins 210a, 210b electrically connected to the circuit pins, as shown in FIG. 9. The aforementioned device pins 210a, 210b are engaged with the first openings 120c of the connection through holes 120a, 120b, wherein the alignment is necessarily strictly realized, as long as the device pins 210a, 210b can be electrically connected with the conductive layers 400a and 400b through the additional through hole and the connection through holes 120a, 120b.

Figure 10:
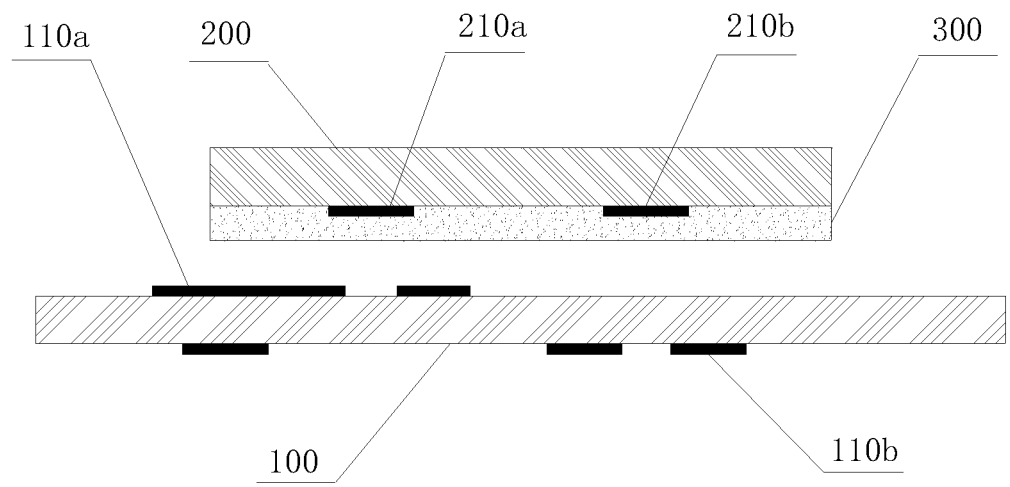
FIG. 10 is a first schematic diagram of a chip connection method according to Third Embodiment of the present disclosure.
Figure 11:
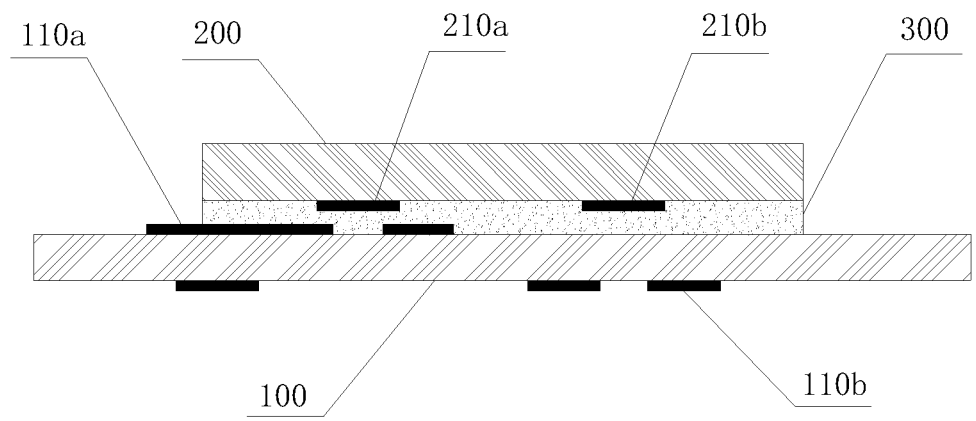
FIG. 11 is a second schematic diagram of a chip connection method according to Third Embodiment of the present disclosure.
Figure 12:
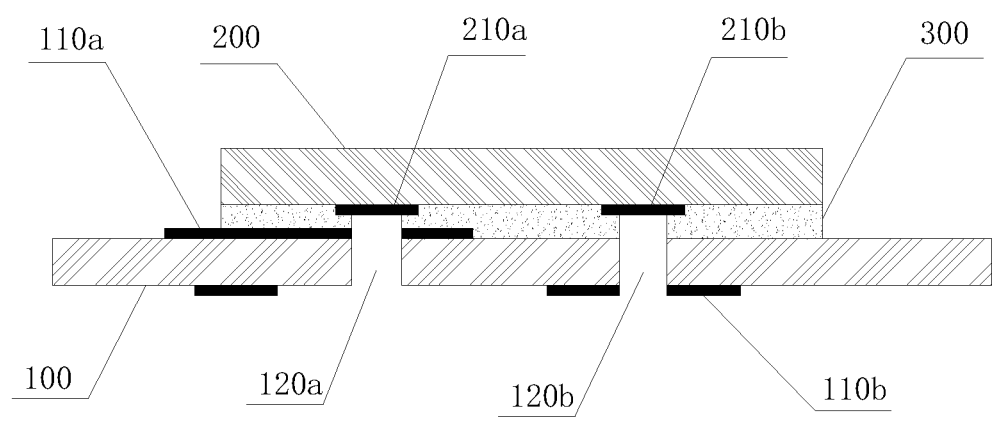
FIG. 12 is a third schematic diagram of a chip connection method according to Third Embodiment of the present disclosure.
Figure 13:
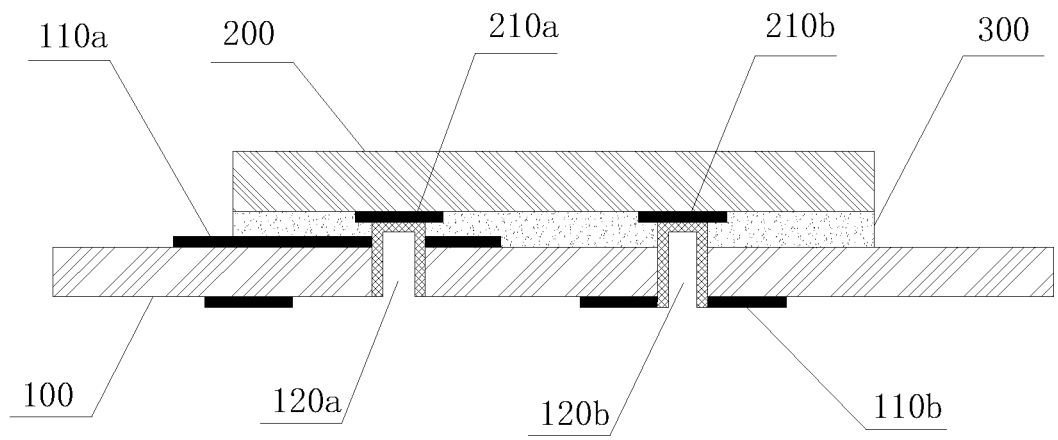
FIG. 13 is a fourth schematic diagram of a chip connection method according to Third Embodiment of the present disclosure.

As shown in FIG. 10, in this embodiment, the protective layers 121a, 121b (auxiliary layers) are electrically connected to the circuit layers 110a, 110b; as shown in FIG. 11, the device 200 is placed on the substrate 100, and the adhesive film (insulating medium 300) adheres the device 200 to the substrate 100; as shown in FIG. 12, an auxiliary through hole is formed in the adhesive film (insulating material); as shown in FIG. 13, the conductive layers 400a, 400b are formed in the connecting through holes 120a, 120b, the conductive layers 400a, 400b makes the device pins 210a, 210b electrically connected to the circuit pins. The auxiliary layers (protective layers 121a, 121b) are directly connected to the circuit pin, the electrical connection effect is good, and the circuit pin can be extended to reduce the volume of the conductive layers 400a, 400b, which is beneficial to the fabrication of the conductive layers 400a, 400b, and is also advantageous for cost reduction.

Third Embodiment

The difference between the third embodiment and the first embodiment lies in the following.

The substrate 100 includes at least two base sheets 101, with the at least two base sheets stacked, and the top surfaces of the base sheets 101 are provided with the circuit layers 110a, 110b, or/and the bottom surfaces of the base sheets 101 are provided with the circuit layers 110a, 110b, at least one of the base sheets 101 is provided with via holes, and at least two of the circuit layers 110a, 110b are electrically connected through the via holes, extending the connection range of devices 200 and achieving more circuit connections in a smaller circuit volume.

Figure 14:
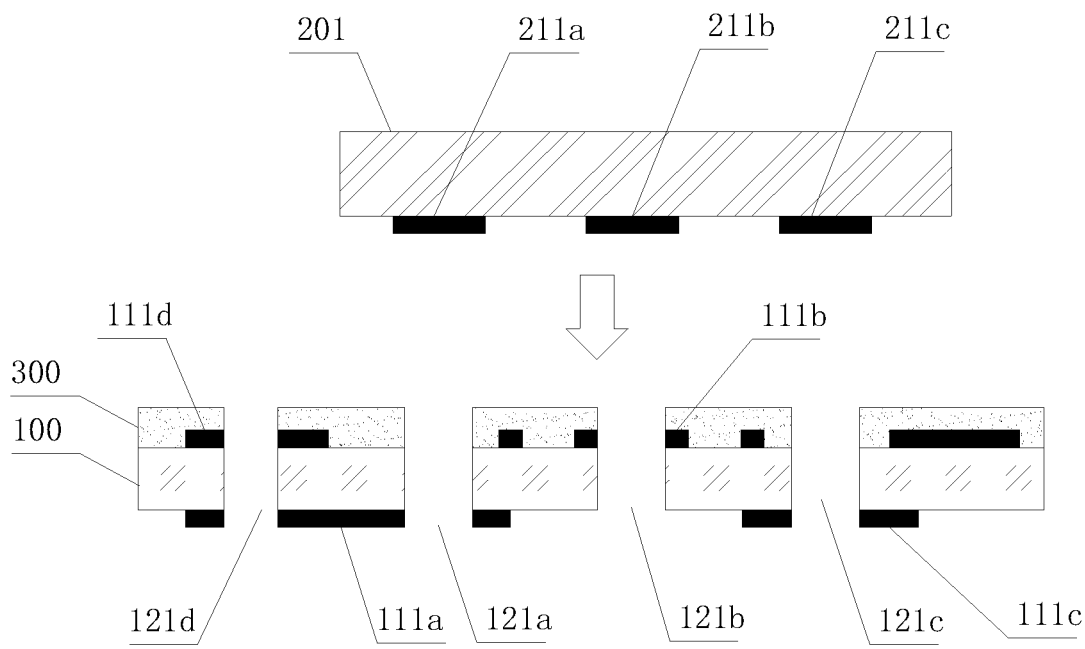
FIG. 14 is a first side view of a chip connection method according to Fourth Embodiment of the present disclosure.

After the conductive layers 400a, 400b are formed, a conductive connection port 500 electrically connected to the conductive layers 400a, 400b is formed on the bottom surface of the substrate 100. As shown in FIG. 14, the conductive connection port 500 is embodied as a soldered ball dot matrix, or a connection dot matrix, or a metal pin grid. The device pin 210c of the device 200 is connected to the conductive connection port 500 of the bottom surface of the substrate 100, which can greatly expand the connection space of the device pin 201c, and facilitate the connection of the device 200 to an external circuit. In order to reduce the volume, devices 200 can be made as small as possible generally, where the space for allowing the device pin 210c to be connected externally is very small. Through the conductive connection through holes 400, 400a, 400b and the circuit layers 110a, 110b at the bottom surface or top surface of the substrate or inside the substrate, the pin 210c of the device can extend to the external conductive connection port 500 on the bottom surface of the substrate, which greatly expands the connection space of the device. The direct benefit of this design is that the access data communication channels can be set at a higher density, while increasing the communication bandwidth and transmission speed.

Fourth Embodiment

The difference between the fourth embodiment and the first embodiment lies in the following.

The devices are chips and the device pins are chip pins. The substrate is provided with a plurality of connection through holes. For the sake of brevity and clarity, the connection through holes are respectively referred to as a first through hole and a second through hole, and each connection through hole is provided therein with a respective conductive layer. For the sake of brevity and clarity, it is referred to that the first conductive layer is provided in the first through hole, the second conductive layer is provided in the second through hole, and the third conductive layer is processed in the third through hole. According to the principle of the circuit, the first circuit layer and the second circuit layer may connection lines, and the connection lines are electrically connected or not connected to the chip or the component, etc. In this embodiment, the circuit layer includes a plurality of connection lines. For the sake of brevity and clarity, these connection lines are recorded as the first connection line, the second connection line, and the third connection line.

As shown in FIG. 14, the chip 201 is provided with chip pins 211a, 211b and 211c. The top surface of the substrate 100 is provided with a first connection line 111b and a third connection line 111d, and the bottom surface of the substrate is processed with second connection lines 111a, 111c.

In this embodiment, the first connection line 111b and the third connection line 111d are provided on the top surface of the substrate 100, and the second connection lines 111a and 111c are provided on the bottom surface of the substrate 100. In this case, it can be considered that in the thickness direction of the substrate 100, the distances between the first connection line 111b and the chip 201 and between the third connection line 111d and the chip are smaller than the distance between the second connection lines 111a, 111c and the chip. However, it is not limited thereto, the first connection line 111b, the second connection lines 111a, 111c, and the third connection line 111d may be embedded inside the substrate 100, as long as that the distance between the first connection line 111b and the chip 201 is less than the distance between the second connection line and the chip 201 in the thickness direction of the substrate 100. At this time, the first connection line 111b and the second connection lines 111a, 111c form "layers" of the two connection lines in a thickness direction of the substrate 100.

Figure 15:
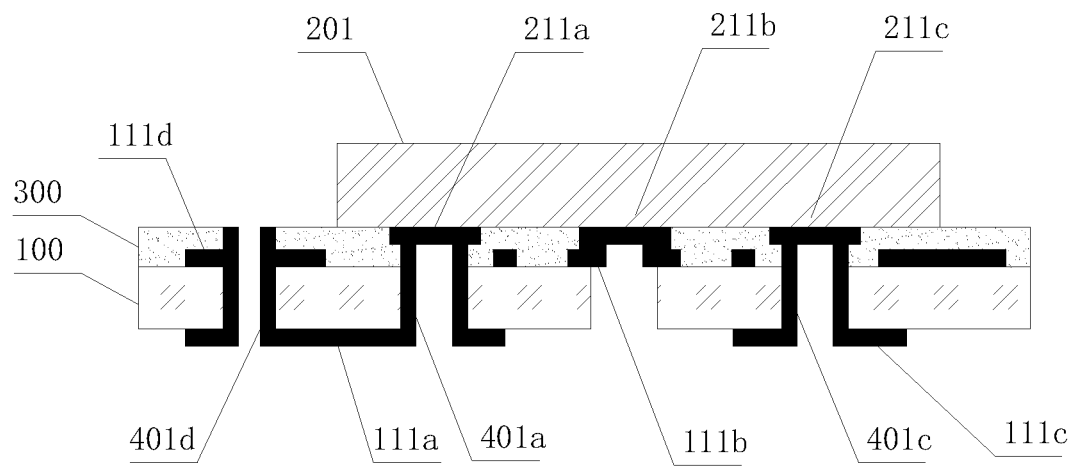
FIG. 15 is a second side view of a chip connection method according to Fourth Embodiment of the present disclosure.

A layer of adhesive film 300 is provided at a top surface of the substrate 100 as shown in FIGS. 14 and 15, the chip is adhered through the adhesive film 300 to the top surface of the substrate 100. By adhering using the adhesive film 300, the chip 201 is placed on the substrate 100, so that the chip 201 can be achieved fixed to the substrate 100, saving steps, increasing efficiency and reducing costs. the adhesive film 300 may be insulated, so that even in the case where the connection line is provided at the top surface of the substrate 100, chip pins 211*a*, 211*b*, 211*c* can be also electrically insulated from the connection lines at the top surface of the substrate 100.

The substrate 100 is provided with a first through hole 121*b*. The first connection line 111*b* is corresponding to the first through hole 121*b*. The first through hole 121*b* is provided therein with a first conductive layer 401*b*. The first conductive layer 401*b* enables electrical connection between the first connection line 111*b* and the chip pins 211*b*. The first conductive layer 401*b* is not shown in the figures. It is not limited to this embodiment, two or more chip pins 211*b* may be electrically connected to the first connection line 111*b*.

The substrate 100 is provided with through holes 121*a* and 121*c*. The second through holes 121*a* and 121*c* are corresponding to the second connection lines 121*a* and 121*c*. The second through holes 121*a* and 121*c* are provided therein with second conductive layers 401*a* and 401*c*. Portions of the second connection lines 121*a*, 121*c* are located near the openings of the second through holes 121*a*, 121*c* or extend into the second through holes 121*a*, 121*c*, such that the second connection lines 121*a*, 121*c* may be electrically connected to the second conductive layers 401*a*, 401*c*. In the above, the chip pin 211*b* is electrically connected to the first connection line 111*b*, and the first conductive layer 401*b* makes the chip pin 211*b* electrically connected with the first connection line 121*b*; the chip pins 211*a*, 211*c* is corresponding to the first openings of the second through holes 121*a*, 121*c*, and the second conductive layers 401*a*, 401*c* makes the chip pins 211*a*, 211*c* electrically connected with the second connection lines 121*a*, 121*c*. It is not limited to this embodiment, two or more chip pins may be electrically connected to the second connection lines 121*a* and 121*c*.

The substrate 100 is provided with a third connection line 111*d* and a third through hole 121*d*. The third through hole 121*d* is provided therein with a third conductive layer 401*d*. In the thickness direction of the substrate 100, the distance between the third connecting layer 111*d* and the chip 201 is smaller than (not limited to this embodiment, may be greater than) the distance between the second connection lines 121*a* and 121*c* and the chip 201. In the present embodiment, the third connection line 111*d* and the first connection line 111*b* are both provided on the top surface of the substrate 100, which is equivalent to that the third connection line 111*d* and the first connection line 111*b* are located in the same "layer" in the thickness direction of the substrate 100, and the second connection lines 121*a*, 121*c* are provided on the bottom surface of the substrate 100, and a metal layer is coated on the top surface and the bottom surface of the substrate 100. Then, the first connection line 111*b*, the second connection lines 121*a* and 121*c*, and the third connection line 111*d* are simultaneously formed by using a photoresist to improve the production efficiency. However, the present disclosure is not limited to this embodiment, and the third connection line 111*d* may not be in the same "layer" as the first connection line 111*b*.

A third conductive layer 401*d* is provided in the third through hole 121*d*, and the second connection line is in number of at least one, wherein the at least one second connection line 121 a has one end corresponding to the second through hole 121*a* and electrically connected to the chip pin 211*a* through the second conductive layer 401*a*, and the other end corresponding to the third through hole 121*d* and electrically connected to the third connection line 111*d* through the third conductive layer 401*d*. Thus, the chip pins 211*a*, 211*c* escape from the dense chip pins surrounding thereof, through the second through holes 121*a*, 121*c*, to the layer where the second connection lines 121*a*, 121*c* are located, and then the second connection line 121*a* escapes through the third through hole 121*d* to the layer where the third connection line 111*d* is located. As required, the design of the layer where the third connection line 111*d* and the second connection lines 121*a*, 121*c* are located and the wiring pattern may help the chip pins escape as much as possible to achieve connection, thereby the density of the chip pins is increased, the connection node density of the chip 201 is increased, and the data transmission speed of the chip 201 is improved. It is not limited to this embodiment, two or more second connection lines 121*a* and 121*c* may be electrically connected to the third connection line 111*d*.

First, the chip pins 211*a*, 211*c* are connected to the second connection lines 121*a*, 121*c* through the second conductive layers 401*a*, 401*c* in the second through holes 121*a*, 121*c*, and the second conductive layers 401*a*, 401*c* is provided through the second openings of the second through holes 121*a*, 121*c*, to avoid the chip 201 from shielding/blocking the chip pins 211*a* and 211*c*, so that the second through holes 121*a* and 121*c* and the chip pins are accurately positioned, thereby improving the connection precision and achieving mass production of the second through holes 121*a* and 121*c* and setting the plurality of chips 201 in batches, greatly improving the production efficiency. The second conductive layers 401*a* and 401*c* are provided in the second through holes 121*a* and 121*c*, without occupying additional space, thereby greatly reducing the overall volume after packaging. In particular, it is a great advantage that a flexible circuit board can be used as the substrate 100.

Figure 16:
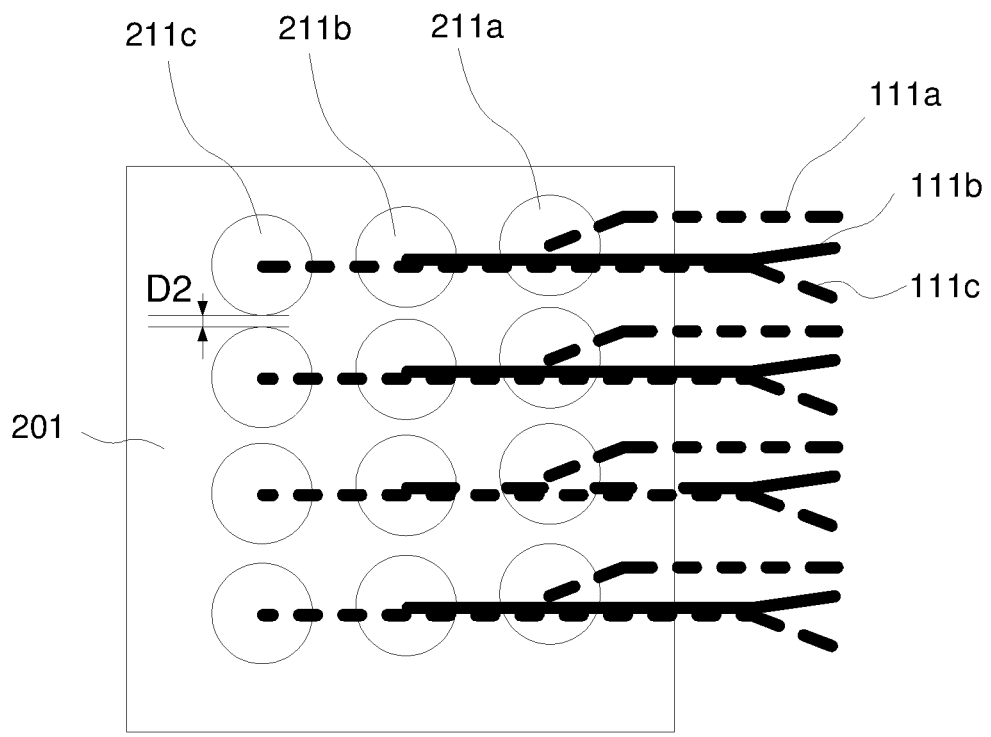
FIG. 16 is a top plan view of a chip connection method according to Fourth Embodiment of the present disclosure.
Figure 17:
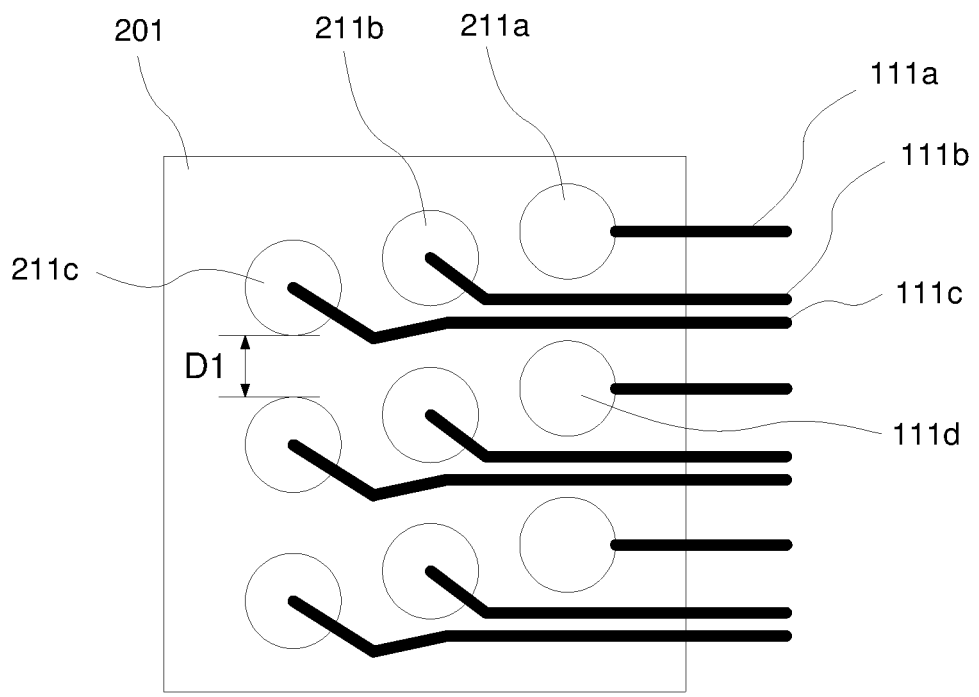
FIG. 17 is a top plan view of a conventional connection method according to Fourth Embodiment of the present disclosure.

Next, the conventional connection method is as shown in FIG. 17, and the connection lines 111*a*, 111*b* and 111*c* are all provided on the top surface of the substrate 100, and the chip pins 211*a*, 211*b* and 211*c* can be led out only in a single plane. At this time, the connection lines 111*a*, 111*b* and 111*c* need to running among the chip pins 211*a*, 211*b*, and 211*c*, and avoid the chip pins 211*a*, 211*b* and 211*c*, so that sufficient gaps need to be reserved among the chip pins for allowing the connection lines to pass therethrough. In this way, the gaps D1 of the chip pins limit the number of connection lines, may not allow more connection lines. Additionally, if the number of chip pins is large enough, the chip pins near the edge of the chip 201 can be led out by the connection lines, however, there is no gap for providing the connection lines to make the chip pins near the middle of the chip 201 led out, so the conventional connection method limits the density of the connection lines and the density of the chip pins. However, in the present disclosure, as shown in FIG. 16, the chip pins are respectively led out through the first connection line 111*b* and the second connection lines 121*a*, 121*c*, and the first connection line 111*b* and the second connection line 121*a*, 121*c* are located in different thickness layers in the thickness direction of the substrate 100, with the two connection lines not interfering with each other. The second connection lines 121*a* and 121*c* do not need to pass through the gap D2 between the chip pins, so that connection lines of higher density can be obtained. Similarly, chip pins with higher density may be provided, and the chip 201 obtains connection nodes of higher density, and the data transmission speed of the chip 201 increases.

During the process of forming the second conductive layers 401a, 401c in the second through holes 121a, 121c through the second openings of the second through holes 121a, 121c, the conductive bonding material is fed from the second opening of the second through holes 121a, 121c into the second through holes 121a and 121c, to make the conductive bonding material adhered to the inner walls of the second through holes 121a and 121c and the chip pins 211a and 211c, forming the second conductive layers 401a, 401c. By feeding the conductive bonding material from the second opening, it is possible to operate on the bottom surface of the substrate 100 without being disturbed by the chip 201. By using a bonding material having electrical conductivity, the chip at the top layer is firmly bonded to the substrate 100 in the second through holes 121a, 121c, to prevent the device from falling off and simultaneously forming conductive channels from the chip pins 211a, 211c of the chip to the second conductive layers 111a, 111c, to obtain good electrical connection properties. The conductive bonding material is a soldered ball, or a solder paste, or a conductive paste, or a conductive metal paste. One or more combinations may be selected according to the needs of the process or the material of the substrate 100, the sizes of the inner walls of the second through holes 121a, 121c, and the nature of the surface material. The process of placing a conductive bonding material to form a conductive connection channel may use common soldering processes, including steps such as surface cleaning, flux spraying, precision placement of solder balls using a ball placing machine, and heat treatment, and may also use more special chemical surface cleaning, surface treatment, precise spraying of solder paste, conductive paste or conductive metal paste, and then heat treatment to form mechanical and electrical connections.

During the process of forming the second conductive layers 401a, 401c in the second through holes 121a, 121c through the second openings of the second through holes 121a, 121c, conductive bonding material is provided in the second through holes 121a, 121c by screen printing, which uses universal equipment and can be synchronized with the production of the second connection lines 111a, 111c, saving the process flow and further reducing the cost.

During the process of forming the second conductive layers 401a, 401c in the second through holes 121a, 121c through the second openings of the through holes 121a, 121c, additional through holes are fabricated in the adhesive film 300 through the second openings of the second through holes 121a, 121c, by laser melting or plasma cleaning or using a chemical solvent. The additional through holes enables the second through holes 121a, 121c to be engaged with the chip pins 211a, 211c, and the second conductive layers 401a, 401c extend into the additional through holes, preventing the adhesive film 300 from impeding the electrical connection of the chip pins 211a, 211c, the second conductive layers 401a, 401c, and the second connection lines 111a, 111c.

A protective layer is provided on the inner walls of the second through holes 121a, 121c for protecting the substrate 100 when fabricating the additional through holes. The fabrication of the additional through holes may be performed by, but not limited to, a process using chemical etching or drilling, in which case it is necessary to pass through the second through holes 121a, 121c, which may cause damage to the inner walls of the second through holes 121a, 121c, and thus the damage to the substrate 100. The protective layer can protect the inner walls of the second through holes 121a, 121c from being damaged. Further, the protective layer may be a material that facilitates electrical connection of the second conductive layers 401a, 401c. At this time, the protective layer may be in electrical contact with the second connection lines 121a, 121c, contributing to electrical connection of the second connection lines 121a, 121c and the second conductive layers 401a, 401c. For example, the protective layer may be a thin metal film which is pre-sputtered or pre-evaporated on the inner walls of the second through holes 121a, 121c, so that the material of the inner walls of the second through holes 121a, 121c is not exposed to the etching solvent or ions during the chemical etching process. Moreover, such a thin metal layer may also improve the electrical conductivity of the second conductive layers 401a, 401c which are subsequently electroplated in the second through holes 121a, 121c.

The method of fabricating the second conductive layer 401a, 401c in the second through holes 121a, 121c may be used to fabricate the first through hole 401b in the first conductive layer 121b, fabricate the third conductive layer 401d in the third through hole 121d, and method similar to the above may be also used to fabricate the additional through hole and the protective layer. Preferably, the first conductive layer 401b, the second conductive layers 401a, 401c and the third conductive layer 401d are fabricated synchronously in the the first through hole 121b, the second through holes 121a, 121c and the third through hole 121d, improving production efficiency.

In this embodiment, the chip pins escape to the layers where the first connection line 111b and the second connection lines 121a, 121c are located, through the first through hole 121b and the second through holes 121a and 121c, respectively, for electrical connection, wherein the first connection line 111b and the second connection lines 121a, 121c form two "layers" in the thickness direction of the substrate 100, but not limited thereto, three or more layers of connection line "layers" may be provided, the chip pins are electrically connected to connection lines in the third, fourth, . . . , nth layers through the abovementioned "hole connection" manner, so that more chip pins can escape from the chip pins surrounding thereof, for electrical connection, thereby increasing the density of the chip pins and improving the data transmission speed of the chip 201.

In this embodiment, the second through holes 121a, 121c make the chip pins 211a, 211c electrically connected to the second connecting layers 121a, 121c, constituting "connection hole". Through a manner similar to the aforementioned "hole connection", the chip pin 211b is electrically connected to the first connection line 111b through the first through hole 121b. However, it is not limited thereto, the electrical connection of the chip pin 211b and the first connection line 111b may be achieved by other means, for example, the chip pin 211b is in direct contact connection with the first connection line 111b.

As required, the substrate 100 may be a normal hard board, or the substrate 100 may also be a flexible circuit board. When the substrate 100 is a flexible circuit board, the chip pins are led out through "hole connection" for connection, improving the density of the chip pins, thereby reducing the volume of the chip 201. Moreover, the first conductive layer 401b and the second conductive layers 401a, 401c are respectively located in the first through hole 121b and the second through holes 121a, 121c, occupying no extra volume. There may be even no need to reserve a gap between the chip 201 and the substrate 100 (but not limited thereto, a gap may be provided as needed, such as an adhesive layer), which may reduce the overall thickness of the chip 201 and the substrate 100. When the substrate 100 is a flexible circuit board or a multilayer flexible circuit board, the overall flexibility can be maintained, for a wearable device or the like. Preferably, when the substrate 100 includes at least two layers of flexible circuit boards stacked, if two "layers" or more of the connection lines are provided, the first connection line 111b, or the second connection lines 121a, 121c and the third connection line 121d, or other connection lines may be provided between adjacent two flexible circuit boards, and then the first through hole 121b, the second through holes 121a and 121c, and the third through hole 121d are formed.

The technical features of the above embodiments may be arbitrarily combined. For the sake of brevity of description, not all possible combinations of the technical features in the above embodiments are described. However, as long as there is no contradiction in the combination of these technical features, it is considered that they fall within the scope described in this specification.

The above embodiments are merely illustrative of several embodiments of the present disclosure, and the description thereof is more specific and detailed, but it is not to be construed as limiting the scope of the present disclosure. It should be noted that a number of variations and modifications may be made by those skilled in the art without departing from the concept of the present disclosure. Therefore, the scope of protection of the present disclosure should be determined by the appended claims.

The invention claimed is:

1. A chip connection method, comprising:
providing a first connection line and a second connection line on a substrate, wherein in a thickness direction of the substrate, a distance between the first connection line and a chip is smaller than a distance between the second connection line and the chip; and
placing the chip on a top surface of the substrate, wherein the chip is provided with at least two chip pins, the substrate is provided with a second through hole, the second through hole is corresponding to the second connection line, and a second conductive layer is provided in the second through hole,
wherein at least one of the chip pins is electrically connected to the first connection line, at least one of the remaining chip pins is corresponding to a first opening of the second through hole, and the second conductive layer makes the chip pins electrically connected to the second connection line,
wherein the substrate is provided with a third connection line and a third through hole;
a distance between the third connection line and the chip is greater or smaller than the distance between the second connection line and the chip in the thickness direction of the substrate:
a third conductive layer is provided in the third through hole; and
the second connection line is in number of at least one, wherein the at least one second connection line has one end corresponding to the second through hole and electrically connected to the chip pin through the second conductive layer, and the other end corresponding to the third through hole and electrically connected to the third connection line through the third conductive layer.

2. The chip connection method according to claim 1, wherein the chip, the first connection line and the third connection line are provided on a top surface of the substrate, and the second connection line is provided on a bottom surface of the substrate.

3. The chip connection method according to claim 1, wherein during a process of forming the second conductive layer in the second through hole through a second opening of the second through hole, the second conductive layer is fed into the second through hole from a second opening of the second through hole.

4. The chip connection method according to claim 3, wherein the second conductive layer is of a soldered ball, a solder paste, or a conductive paste.

5. The chip connection method according to claim 3, wherein a conductive bonding material is provided in the second through hole by screen printing.

6. The chip connection method according to claim 1, wherein an adhesive film is provided between the chip and the substrate, with the adhesive film configured to bond the chip to the substrate.

7. The chip connection method according to claim 6, wherein through a second opening of the second through hole, an additional through holes are formed in the adhesive film by laser melting or plasma cleaning, or using a chemical solvent, the additional through holes make the second through hole engaged with the chip pins, and the second conductive layer extends into the additional through holes.

8. The chip connection method according to claim 7, wherein a protective layer is provided at an inner wall of the second through hole, with the protective layer configured to protect the substrate when the additional through holes are formed.

9. The chip connection method according to claim 1, wherein the substrate is provided with a first through hole, the first connection line is corresponding to the first through hole, a first conductive layer is provided in the first through hole, and the first conductive layer makes the first connection line electrically connected to the chip pins.

10. The chip connection method according to claim 1, wherein the substrate is a flexible circuit board; or the substrate comprises at least two layers of flexible circuit boards with one stacked on another.

11. A chip connection structure, comprising:
a chip, placed on a top surface of a substrate, wherein the substrate is provided with a first connection line and a second connection line, a distance between the first connection line and the chip is smaller than a distance between the chip and the second connection line in a thickness direction of the substrate, the chip is provided with at least two chip pins, the substrate is provided with a second through hole, the second through hole is corresponding to the second connection line, and a second conductive layer is provided in the second through hole,
wherein at least one of the chip pins is electrically connected to the first connection line, at least one of the remaining chip pins is corresponding to the second through hole, and a first conductive layer is configured to make the chip pins electrically connected to the second connection line,
wherein the substrate is provided with a third connection line and a third through hole;
the third through hole is provided therein with a third conductive layer;
in the thickness direction of the substrate, a distance between the third connection line and the chip is greater than or equal to the distance between the second connection line and the chip; and the second connection line is in number of at least one, wherein the at least one second connection line has one end corresponding to the first through hole, and the other end corresponding to the second through hole, and the second connection line has one end electrically connected to the chip pins through the second conductive layer, and the other end electrically connected to the third connection line through the third conductive layer.

12. The chip connection structure according to claim 11, wherein the substrate is provided with a first through hole, the first connection line is corresponding to the first through hole, a first conductive layer is provided in the first through hole, and the first conductive layer is configured to make the first connection line electrically connected to the chip pins.

13. The chip connection structure according to claim 11, wherein the chip, the first connection line and the third connection line are provided at the top surface of the substrate, and the second connection line is provided at a bottom surface of the substrate.

14. The chip connection structure according to claim 11, wherein the chip and the first connection line are provided on the top surface of the substrate, and the second connection line is provided at a bottom surface of the substrate.

15. The chip connection structure according to claim 11, wherein the substrate is a flexible circuit board; or the substrate comprises at least two layers of circuit boards with one stacked on another.

16. The chip connection method according to claim 2, wherein the substrate is provided with a first through hole, the first connection line is corresponding to the first through hole, a first conductive layer is provided in the first through hole, and the first conductive layer makes the first connection line electrically connected to the chip pins.

17. The chip connection method according to claim 2, wherein the substrate is provided with a first through hole, the first connection line is corresponding to the first through hole, a first conductive layer is provided in the first through hole, and the first conductive layer makes the first connection line electrically connected to the chip pins.

18. The chip connection method according to claim 3, wherein the substrate is provided with a first through hole, the first connection line is corresponding to the first through hole, a first conductive layer is provided in the first through hole, and the first conductive layer makes the first connection line electrically connected to the chip pins.

19. The chip connection method according to claim 3, wherein the second conductive layer is a metal layer, with the metal layer formed by an immersion gold method, a sputtering method, or an electroplating method.

* * * * *